United States Patent [19]
Lazarus et al.

[11] Patent Number: 5,342,734
[45] Date of Patent: Aug. 30, 1994

[54] DEEP UV SENSITIVE PHOTORESIST RESISTANT TO LATENT IMAGE DECAY

[75] Inventors: Richard M. Lazarus, Mission Viejo, Calif.; John J. Grunwald, Ramat-gan, Israel; Chava Gal, Ramot Hashavim, Israel; Shulamit Hirsch, Tel-Aviv, Israel

[73] Assignee: Morton International, Inc., Chicago, Ill.

[21] Appl. No.: 882,207

[22] Filed: May 13, 1992

Related U.S. Application Data

[63] Continuation-in-part of Ser. No. 842,846, Feb. 25, 1992, abandoned.

[51] Int. Cl.$^5$ .............................................. G03C 1/492
[52] U.S. Cl. ................................... 430/270; 430/326; 430/192; 430/193
[58] Field of Search ................ 430/270, 326, 192, 193

[56] References Cited

U.S. PATENT DOCUMENTS

| | | | |
|---|---|---|---|
| 3,779,778 | 12/1973 | Smith et al. | 96/115 R |
| 3,915,706 | 10/1975 | Limburg et al. | 96/27 R |
| 4,273,668 | 6/1981 | Crivello | 252/182 |
| 4,311,782 | 1/1982 | Buhr et al. | 430/270 |
| 4,491,628 | 1/1985 | Ito et al. | 430/176 |
| 4,678,737 | 7/1987 | Schneller et al. | 430/270 |
| 5,037,721 | 8/1991 | Doessel | 430/270 |
| 5,166,033 | 11/1992 | Oie et al. | 430/192 |

OTHER PUBLICATIONS

Nalamasu et al.; *Effect of Post–Exposure Delay in Positive Acting Chemically Amplified Resists: An Analytical Study;* Regional Technical Conference of the Mid–Hudson Section of the Society of Plastics Engineers; Oct., 1991.

Przybilla et al.; *t–BOC Blocked hydroxyphenyl–Meth-a-crylates: On the Way to Quarter Micron Deep–UV Lithography;* Regional Technical Conference of the Mid–Hudson Section of the Society of Plastics Engineers; Oct. 1991.

Houlihan et al.; *Phase transfer catalysis in the tert-butyloxycarbonylation of alcohols, phenols, and thiols with di-tert-butyl dicarbonate;* Can. J. Chem., 63 (1985).

*Primary Examiner*—Marion E. McCamish
*Assistant Examiner*—Mark A. Chapman
*Attorney, Agent, or Firm*—Robert M. Didrick; Gerald K. White

[57] ABSTRACT

A positive working deep UV sensitive photoresist which provides improved critical dimension stability during prolonged periods of post exposure delay before baking comprises an acid stable polymer which is insoluble in water but normally soluble in an aqueous alkaline medium, a photoinitiator which generates acid upon exposure to actinic radiation, and a mixed carbonate ester of tertiary butyl alcohol and a polyhydric phenol which is an acid labile compound which inhibits the dissolution of the normally soluble polymer in said alkaline medium.

20 Claims, No Drawings

DEEP UV SENSITIVE PHOTORESIST RESISTANT TO LATENT IMAGE DECAY

This is a continuation-in-part of copending application Ser. No. 07./842,846 filed on Feb. 25, 1992 now abandoned.

FIELD OF THE INVENTION

This invention relates to a deep ultra-violet radiation sensitive composition which contains a polymeric binder which is insoluble in water but normally soluble in aqueous alkaline media, an acid labile organic compound which inhibits the dissolution of the binder in aqueous alkaline but which decomposes in contact with an acid, and a photoinitiator which generates acid upon exposure to actinic radiation. The composition is particularly suitable as a positive working photoresist wherein the exposed portions are rendered soluble or developable by deep UV radiation and can be removed with selective developing solutions while the unexposed portions remain intact. Thus imagewise exposure of the composition and development yields an image corresponding to the original image.

BACKGROUND OF THE INVENTION

The sensitivity of photolithographic systems based on diazonaphthoquinone sensitized novolac resins is limited by the quantum efficiency of the sensitizer to photoproduct conversion. It is too low for practical use in deep UV work because of the very low power that is available from exposure sources in those wavelengths. A dramatic increase in sensitivity in radiation-sensitive systems, often referred as chemical amplification, is obtained when a species produced in the primary photoreaction independently initiates a catalytic secondary reaction, thus increasing the quantum yield to values above one. For example, systems which photochemically produce a strong acid which then cleaves acid labile groups in a secondary reaction are disclosed in U.S. Pat. No. 3,915,706 for positive working polyaldehydes.

Radiation sensitive mixtures which contain, as a binder, a polymer which is soluble in aqueous alkaline media, a compound which forms a strong acid by a photochemical reaction, and another compound which possesses acid cleavable C—C—C bonds and whose solubility in a liquid developer is increased by the action of acid are disclosed in U.S. Pat. No. 4,678,737.

Photosolubilizable compositions which are readily removable by developing solutions in areas exposed to actinic radiation are taught in U.S. Pat. No. 3,779,778. That composition comprises a water-insoluble organic compound containing one or more acid degradable linkages of the general formula

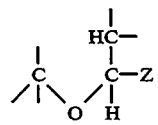

wherein Z may be —OAr, among others, and a photolyzable acid progenitor which upon exposure to actinic radiation generates an acidic condition.

U.S. Pat. No. 4,311,782 shows a radiation sensitive mixture which contains an acid forming compound and a polymeric compound having recurrent orthocarboxylic acid ester groupings for the production of positive relief images.

U.S. Pat. No. 4,491,628 shows a deep UV sensitive resist composition which is made by combining a polymer having recurrent acid labile pendant groups, e.g., poly (p-tert-butoxycarbonyloxy-$\alpha$-methylstyrene), with a cationic photoinitiator such as a triarylsulfonium hexafluoroantimonate. Such compositions are taught there to be particularly useful and advantageous when used with deep UV light (200–300 nm) because they give very high resolution images with nearly vertical wall angles even in films thicker than 2 microns.

More recently, U.S. Pat. No. 5,037,721 has taught a positive radiation sensitive mixture that exhibits no change in the development time whether the time between irradiation and development is long or short, and provides high structural resolution of the developed resist that is retained during processing steps subsequent to the development. Said mixture comprises a compound which forms an acid under the action of actinic radiation and a particular type of monomeric acid-cleavable compound which contains an acetal group. This patent has a good discussion of the acid-cleavable materials which had been employed already, and it is incorporated herein by reference for that purpose. Neither the '721 patent nor those mentioned therein, however, address the problem of latent image decay, which causes critical dimensions (CD) to change in the time between the exposure and the post exposure bake step, which is performed before development.

Latent image decay is the most critical problem in chemical amplification systems for imaging semiconductors. In a paper presented at the Regional Technical Conference of the Mid-Hudson Section of the Society of Plastics Engineers in October of 1991 by Nalamasu et al. and entitled Effect of Post-Exposure Delay in Positive Acting Chemically Amplified Resists: An Analytical Study, it was said, "For TBSS/PAG resist formulations, it is crucial to post exposure bake the material immediately after exposure in order to achieve acceptable line-width control." TBSS is a modified acronym for poly t-butoxycarbonyloxystyrene-sulfone and PAG is an acronym for photoacid generators. In another paper presented at that conference, and entitled t-BOC Blocked Hydroxyphenyl-Meth-acrylates: On the Way TO Quarter Micron Deep-UV Lithography, Przybilla et al. said that virtually no increase in dose-to-clear and influence on structure quality was observed for delay intervals of up to 20 minutes in a t-BOC system when a sulfonic acid generator such as triphenylsulfonium triflate is used but that a more severe dependence on the time between exposure and post exposure bake was observed when onium salts with complex fluorides such as antimony hexafluoride as the counter ion were used as the acid generator. The Nalamasu et al. paper and the Przybilla et al. paper are each incorporated herein by reference for their presentation of the problem which this invention solves.

SUMMARY OF THE INVENTION

It is an object of this invention, therefore, to provide a positive working deep UV sensitive resist which demonstrates improved CD stability during prolonged hold times between exposure of the resist and the post exposure bake.

It is a related object of this invention to provide a CD stable, deep UV sensitive photoresist whereby the overall yield of the photolithographic process for manufacturing semiconductors and the like is improved.

It is another object of this invention to provide a deep UV sensitive recording material comprising a layer of the photoresist on a substrate.

It is another object of this invention to provide a method for producing an imaged recording material by deep UV radiation.

These and other objects which will become apparent from the following description of the invention are achieved by a positive photoresist composition comprising an acid stable polymer which is insoluble in water but normally soluble in an aqueous alkaline medium; a photoinitiator which generates acid upon exposure to actinic radiation; and a mixed carbonate ester of tertiary butyl alcohol and a polyhydric phenol which is an acid labile compound which inhibits the dissolution of the normally soluble polymer in said alkaline medium.

DETAILED DESCRIPTION OF THE PREFERRED EMBODIMENTS

Suitable substrates for the recording materials are all materials used for condensers, semiconductors, multilayer printed circuit boards, or integrated circuits. In particular, substrates having surfaces which are made of thermally oxidized and/or aluminum coated silicon material, which may be doped, are suitable along with other substrates which are customary in semiconductor technology such as silicon nitride, gallium arsenide, and indium phosphide. In addition, substrates known in the manufacture of liquid crystal displays such as glass, indium/tin oxide, metal plates and foils made of aluminum, copper or zinc, for example, and bimetallic and trimetallic foils are suitable.

In the method for the production of the deep UV sensitive recording material, a solution of the photoresist is applied on the substrate by spraying, roller-coating, flow coating, dip coating, or by spin coating. The solvent is then removed in a soft bake step in which the temperature of the substrate and resist may be raised as high as 140° C. for up to about 90 seconds. The resulting film is then exposed imagewise to actinic radiation having a wavelength of from 200 to 300 nm, preferably from about 240 to about 270 nm. UV lamps which emit radiation at such wavelengths at an intensity of about 0.5 to about 60 mW/cm$^2$ are suitable. An Oriel brand contact printer working at a wavelength of about 254 nm and an excimer laser-powered deep UV stepper at about 248 nm. such as is available under the trademark GCA, are representative of exposure systems suitable for this invention. In the portions of the film on which the radiation falls, the radiation causes the release of acid from the photoinitiator and the acid labile dissolution inhibitor begins to decompose in the presence of the acid. The exposed resist is baked at temperatures up to about 120° C. in order to accelerate the decomposition of the acid labile inhibitor. This post baking step may be delayed for as long as about 2 hours or even longer if necessitated by the production schedule without changing the critical dimensions of the image which is subsequently revealed by treating the film with a developer to dissolve the resist which has regained its solubility in alkaline media by the decomposition of the dissolution inhibitor.

Solutions of alkaline reagents such as the silicates, metasilicates, hydroxides, hydrogen phosphates, dihydrogen phosphates, carbonates, and hydrogen carbonates of alkaline metals or ammonia are suitable as the developer. Quaternary ammonium hydroxides such as the NMD-3 tetramethylammonium hydroxide and the like are also useful as developers. The concentration of these bases in the aqueous developer solution is from about 0.1% to about 15% by weight, preferably from 0.5% to about 5% by weight of the solution.

The acid stable, water-insoluble binder may be a poly-(p-hydroxystyrene), a poly(p-hydroxy-α-methylstyrene), a polymer made from homologs of the respective monomers therein having alkyl substituents on the benzene ring or a mixture thereof to provide the desired solubility in commercial developers while maintaining an optical transparency to deep UV radiation that is similar to that offered by the unsubstituted poly(p-hydroxy styrene). It is called acid stable to reflect the absence of acid labile groups such as that known as the "t-boc" or t-butyloxycarbonyloxy group. The polymer is of moderate molecular weight of from about 5000 to about 30,000, preferably about 15,000 or less. The amount of the binder is generally from about 55% to about 85%, preferably from about 65% to about 80% by weight of the solids in the resist.

Any substance which produces strong acid upon exposure to deep UV radiation can be the photoinitiator. Triarylsulfonium salts, wherein the aromatic rings may be substituted, are preferred and among these, the hexafluoroantimonate salt is preferred over the tetrafluoroborate, hexafluoroarsenate, and hexafluorophosphate salts. Onium salt photoinitiators of Group VIa elements having an $MF_6^-$ anion and M is P, As, or Sb are taught in U.S. Pat. No. 4,273,668, which is incorporated herein by reference. The concentration of the photoinitiator is from about 1% to about 20% of the total weight of solids in the resist. The weight ratio of the acid generating photoinitiator to the acid labile dissolution inhibitor is from about 0.1:1 to about 1.6:1, preferably from about 0.4:1 to about 1.1:1.

The acid labile dissolution inhibitor, being a mixed carbonate ester of tertiary butyl alcohol and a polyhydric phenol, does contain the "t-boc" group. The polyhydric phenol to which the t-boc group is attached is exemplified by pyrogallol, resorcinol, catechol, hydroquinone, phloroglucinol, hydroxyhydroquinone, trihydroxy- and tetrahydroxybenzophenone, and the acetone/pyrogallol condensation products represented by the line formula

[—$C_6H_3(OH)_3$—$C(CH_3)_2$—]$_x$ wherein x is from 2 to about 12 or the fused ring structure of hexahydroxyspirobiindene. The concentration of the acid labile dissolution inhibitor is from about 8% to about 18% of the total weight of solids in the resist. The inhibitor may be prepared by the base-catalyzed alcoholysis of di-t-butyl carbonate, a well known procedure, with the selected polyhydric phenol in an amount such that from about 10% to 100% of the hydroxyl groups are protected by a t-butyloxycarbonyloxy substituent. Fast, high yield reactions of equimolar amounts of phenols and di-t-butyl carbonate in tetrahydrofuran, ethyl acetate, or dichloromethane at 0° C. to about room temperature in the presence of a catalytic amount of 18-crown-6 and an equivalent amount of powdered potassium carbonate are described by Houlihan et al. in a paper entitled: Phase transfer catalysis in the tert-butyloxycarbonylation of alcohols, phenols, enols, and thiols with di-tert-butyl dicarbonate, in Can. J. Chem. 63, 153, (1985). The use of less than 0.1% of 4-N,N-dimethylamino-pyridine as the catalyst in THF also gives good yields.

Improved image quality is achieved by the addition of from about 8% to about 18% by weight of the solids in the total composition of the product obtained from the reaction of 2-diazo-1-naphthoquinone-4-sulfonyl chloride (2,1,4 DNQ) or its structural homolog, 2,1,5 DNQ, with a novolac resin from the condensation of a cresol and formaldehyde. The 2,1,4-DNQ coupled resins are preferred. Mixtures of coupled products utilizing the two homologs are contemplated for the purposes of this invention. A preferred novolac resin is derived from p-cresol.

To aid in the application of the resist to the substrate, the photoresist mixture of this invention is usually dissolved in solvents such as ethylene glycol, and ethers thereof, e.g., the monomethyl, monoethyl, and dimethyl ether; propylene glycol monoalkyl ethers; aliphatic esters such as ethyl lactate, hydroxyethyl acetate, alkoxyethyl acetate, propylene glycol monomethyl ether acetate; other ethers such as dioxane; ketones, including methyl ethyl ketone, methyl isobutyl ketone, cyclopentanone, and cyclohexanone; dimethylformamide, dimethylacetamide, butyrolactone, and tetrahydrofuran, among others, and in admixtures. The glycol ethers and aliphatic esters, such as ethyl lactate and propylene glycol monomethyl ether acetate are particularly preferred.

Additives such as dyes, pigments, plasticizers, wetting agents, adhesion promoters, and flow-control agents may be incorporated in the photoresist of this invention in order to improve specific properties such as attenuation of reflective effects, sensitivity, flexibility, and the like.

The solutions of the photoresist as applied to the substrate generally have a solids content of from about 20% to about 50% by weight of the solution, and preferably from about 20% to about 30%.

BEST MODE FOR CARRYING OUT THE INVENTION

Preparation of Intermediates

All parts in these preparative methods and in the working examples are by weight unless otherwise stated.

Potassium carbonate (1.1 equivalents) was added to a solution of pyrogallol (1 equivalent) in tetrahydrofuran and the mixture was stirred for one-half hour. Di-tert-butyl carbonate (1.1 equivalents) was then added and the reaction mixture was stirred overnight (about 12 hours) at room temperature (about 20°–25° C.). An equal volume of tetrahydrofuran was added and the mixture was filtered. The filtrate was neutralized with glacial acetic acid and then concentrated to one-fourth of its volume under vacuum. The concentrate was poured into an excess of water with vigorous agitation. A slurry formed and this was filtered to isolate the t-Boc capped pyrogallol which was used in Examples 1 and 2.

Hexahydrospirobiindene was made by heating a solution of pyrogallol (756 parts), acetone (552 parts), glacial acetic acid (534 parts), and p-toluene sulfonic acid (14) at reflux temperature (95°–110° C.) for 8 hours. The reaction mixture was cooled and filtered; a slurry of the solid in water was filtered and the remaining solid was washed on the filter with water and then dried in an oven. The product was then t-Boc capped according to the general procedure used for pyrogallol and it was used in Example 3.

The 1-naphthalene sulfonic acid, 3-diazo-3, 4-dihydro4-oxo-ester of a cresol/formaldehyde novolak resin used in Example 3 was made as follows: To tetrahydrofuran (110 parts) was added 43.3 parts of the cresol/formaldehyde novolak resin and the solution was filtered. To the filtrate was added 38.4 parts of the 2, 1, 4 DNQ mentioned above and the reaction mixture was stirred at a moderate rate as 19.0 parts of N,N-diethylethanolamine was added at such a rate as to keep the pH below 6.0 and the temperature in the range of 25°–30° C. When all of the base has been added, the pH is allowed to rise to 7 and hold there for 5 minutes whereupon 2 parts of concentrated hydrochloric acid are added in one charge. After 15 minutes of mixing at room temperature, the mixture is added over a 15 minute period to 4 liters of rapidly agitated dilute hydrochloric acid. The resulting slurry is filtered and the residue is washed with deionized water. The wet cake is dried at room temperature in a vacuum.

The 1-naphthalene-sulfonic acid, 3-diazo-3, 4-dihydro5-oxo-ester of the novolak resin was made as follows: To 110 parts of acetone at room temperature there was added 43.3 parts of the cresol/formaldehyde resin with stirring. The solution was then filtered and 38.4 parts of the 2, 1, 5 DNQ were added to the filtrate and the mixture was stirred at a moderate rate as 19 parts of N, N-diethylethanolamine were added at such a rate as to keep the pH below 7.2 and the temperature in the range of 25°–30° C. When all of the base has been added and the pH has risen to 7.2 and held there for 15 minutes, 2 parts of concentrated hydrochloric acid are added in one charge to the reaction mixture. The acidified mixture is stirred for 15 minutes and then added slowly over a 15 minute period to 4 liters of dilute hydrochloric acid with rapid stirring. The resulting slurry is filtered and the residue is washed with deionized water. The washed filter cake is dried at room temperature in a vacuum.

The following examples illustrate the preferred formulations.

EXAMPLE 1

| | |
|---|---|
| Triphenysulfonium hexafluoroantimonate (50%$_w$ in propylene carbonate) | 3.8 parts |
| t-Boc-capped pyrogallol | 3.11 parts |
| Poly(hydroxystyrene) Maruzen 5000 | 18.62 parts |
| Propyleneglycol monomethylether acetate | 74.42 parts |
| Troykyd 366 | 0.05 part |
| | 100.00 parts |

EXAMPLE 2

| | |
|---|---|
| Triphenylsulfonium hexafluoroantimonate (50%$_w$ in propylene glycol) | 3.69 parts |
| t-Boc-capped pyrogallol | 3.02 parts |
| Poly(hydroxystyrene) Maruzen 5000 | 18.12 parts |
| Propyleneglycol monomethylether acetate | 72.20 parts |
| 1-naphthalene sulfonic acid, 3-diazo-3,4-dihydro-4-oxo ester of cresol/formaldehyde | 2.92 parts |
| Troykyd 366 | 0.05 part |
| | 100.00 parts |

EXAMPLE 3

| | |
|---|---|
| Triphenylsulfonium hexafluoroantimonate (50%$_w$ in propylene glycol) | 3.65 parts |

-continued

| | |
|---|---|
| Poly(hydroxystyrene) Maruzen 5000 | 17.93 parts |
| t-Boc-capped hexahydroxyspirobiindene | 2.99 parts |
| 1-naphthalene sulfonic acid, 3-diazo-3,4-dihydro-4-oxo ester of cresol/formaldehyde | 3.84 parts |
| Troykyd 366 | 0.05 part |

Procedure for Making a Photoresist Coated Silicon Wafer

EXAMPLE 4

Hexamethyldisilazane was deposited as an adhesion promoter on a 4-inch diameter silicon wafer and spread out evenly by spinning the wafer at 2000 rpm for 5 seconds and then at 5000 rpm for 15 seconds. The product of Example 2 was then spread evenly over the wafer by spinning it at 3000 rpm for 5 seconds and at 6000 rpm for another 15 seconds. The still wet wafer was softbaked at 120° C. for 60 seconds. The resulting photoresist coating was about 1 micron thick. The photoresist was then exposed imagewise to UV radiation at a wavelength of 254 nm and a dose of about 5mj/cm$^2$ in an Oriel contact printer. Post exposure bake at 90° C./10 seconds was delayed for 30 minutes and then the image was developed by immersion in a 50%$_w$ NMD-3 bath for 20 seconds. No major line broadening was observed through a JEOL 840F field emission scanning electron microscope.

EXAMPLE 5

The general procedure of Example 4 was repeated except that the post-exposure bake was delayed for 60 minutes. Still no major line broadening was observed by SEM.

EXAMPLE 6

The general procedure of Example 4 was repeated except that the product of Example 3 was used. The results were similar to those of Example 4.

We claim:

1. A positive working photoresist composition comprising, in admixture:
   a polymer insoluble in water but normally soluble in an aqueous alkaline medium;
   a photoinitiator which generates an acid upon exposure to actinic radiation; and
   a mixed carbonate ester of tertiary butyl alcohol and a polyhydric phenol which is an acid labile compound which inhibits the dissolution of the normally soluble polymer in said alkaline medium.

2. The composition of claim 1 wherein the polymer is a poly (vinyl phenol).

3. The composition of claim 1 wherein the photoinitiator is a triarylsulfonium salt.

4. The composition of claim 3 wherein the salt is a hexafluoroantimonate salt.

5. The composition of claim 1 wherein the polyhydric phenol is pyrogallol.

6. The composition of claim 1 wherein the polyhydric phenol is a product of the condensation of acetone and pyrogallol.

7. The composition of claim 6 wherein the polyhydric phenol is hexahydrospirobiindene.

8. The composition of claim 1 wherein the carbonate ester is from about 3% to about 5% by weight of the total weight.

9. The composition of claim 1 wherein the polyhydric phenol is selected from the group consisting of pyrogallol, resorcinol, catechol, hydroquinone, phloroglucinol, hydroxyhydroquinone, trihydroxybenzophenone, and tetrahydroxybenzophenone.

10. A positive working photoresist composition comprising, in admixture:
    an acid stable polymer insoluble in water but normally soluble in an aqueous alkaline medium;
    a triarylsulfonium salt which generates an acid upon exposure to actinic radiation; and
    a mixed carbonate ester of tertiary butyl alcohol and a polyhydric phenol which is an acid labile compound which inhibits the dissolution of the normally soluble polymer in said alkaline medium.

11. The composition of claim 10 wherein the polyhydric phenol is pyrogallol.

12. The composition of claim 10 wherein the polyhydric phenol is the product of the condensation of acetone and pyrogallol.

13. The composition of claim 12 wherein the polyhydric phenol is hexahydrospirobiindene.

14. A radiation sensitive composition comprising:
    compound which forms an acid under the action of actinic radiation; and
    an acid labile carbonate ester of tertiary butyl alcohol and a polyhydric phenol.

15. The composition of claim 14 wherein the polyhydric phenol is pyrogallol.

16. The composition of claim 14 wherein the acid forming compound is a triarylsulfonium salt.

17. The composition of claim 16 wherein the salt is a hexafluoroantimonate salt.

18. A radiation sensitive recording material which comprises a support and a recording layer thereon, said recording layer comprising, in admixture:
    an acid stable polymer insoluble in water but normally soluble in an aqueous alkaline medium;
    a photoinitiator which generates an acid upon exposure to actinic radiation; and
    a mixed carbonate ester of tertiary butyl alcohol and a polyhydric phenol.

19. The recording material of claim 18 wherein the polyhydric phenol is pyrogallol.

20. The recording material of claim 18 wherein the polyhydric phenol is a condensation product of acetone and pyrogallol.

* * * * *

UNITED STATES PATENT AND TRADEMARK OFFICE
CERTIFICATE OF CORRECTION

PATENT NO. : 5,342,734
DATED : August 30, 1994
INVENTOR(S) : Lazarus et al.

It is certified that error appears in the above-identified patent and that said Letters Patent is hereby corrected as shown below:

Column 1, line 47, change "C-C-C" to read --C-O-C--

Column 2, line 47, change "TO" to read --To--

Column 4, line 48, change "[-C$_6$H$_3$(OH)$_3$-*C(CH3)2*-]x" to read --[-C$_6$H(OH)$_3$-C(CH$_3$)$_2$- ]$_x$--

Signed and Sealed this

First Day of November, 1994

Attest:

BRUCE LEHMAN

Attesting Officer

Commissioner of Patents and Trademarks